(12) United States Patent
Karpov et al.

(10) Patent No.: US 7,271,403 B2
(45) Date of Patent: Sep. 18, 2007

(54) ISOLATING PHASE CHANGE MEMORY DEVICES

(75) Inventors: Ilya Karpov, Santa Clara, CA (US); Ward Parkinson, Boise, ID (US); Sean Lee, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/319,183

(22) Filed: Dec. 13, 2002

(65) Prior Publication Data

US 2004/0113154 A1    Jun. 17, 2004

(51) Int. Cl.
*H01L 47/00*    (2006.01)
(52) U.S. Cl. .............. 257/2; 257/73; 257/3; 257/4; 257/5
(58) Field of Classification Search ............ 257/2, 257/3, 4, 5, 7; 365/163, 103, 105
See application file for complete search history.

(56) References Cited

U.S. PATENT DOCUMENTS

| | | | | |
|---|---|---|---|---|
| 3,961,351 A | * | 6/1976 | Blatt ........................ | 257/477 |
| 4,174,521 A | * | 11/1979 | Neale ....................... | 257/485 |
| 4,531,144 A | * | 7/1985 | Holmberg ................ | 257/767 |
| 4,599,705 A | * | 7/1986 | Holmberg et al. ........ | 365/163 |
| 5,166,901 A | * | 11/1992 | Shaw et al. .............. | 365/105 |
| 5,225,359 A | * | 7/1993 | DeLong .................... | 438/328 |
| 5,920,788 A | * | 7/1999 | Reinberg .................. | 438/466 |
| 6,487,106 B1 | * | 11/2002 | Kozicki ................... | 365/153 |
| 6,815,308 B2 | * | 11/2004 | Holscher et al. ........ | 438/401 |
| 2002/0160574 A1 | * | 10/2002 | Zahurak et al. .......... | 438/283 |
| 2002/0195660 A1 | * | 12/2002 | Lee .......................... | 257/344 |

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors,"presented at 2003 19th IEEE Non-Volatile Semiconductor Memory Workshop, Monterey, California, Feb. 26-20, 2003.
Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

(Continued)

*Primary Examiner*—Evan Pert
*Assistant Examiner*—Tan Tran
(74) *Attorney, Agent, or Firm*—Trop, Pruner & Hu, P.C.

(57) ABSTRACT

A phase change memory may be made using an isolation diode in the form of a Schottky diode between a memory cell and a word line. The use of Schottky diode isolation devices may make the memory more scaleable in some embodiments.

14 Claims, 2 Drawing Sheets

OTHER PUBLICATIONS

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

Karpov et al., "Isolating Phase Change Memory Devices", U.S. Appl. No. 10/318,704, filed Dec. 13, 2002.

* cited by examiner

ISOLATING PHASE CHANGE MEMORY DEVICES

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

Because of the high potential storage capacity of phase change memories, and for other reasons, it would be desirable to make phase change memories with as many memory storage locations as possible per unit of area. One issue with existing phase change memories is that an isolation diode may be between the memory cell itself and the word line. The isolation diode is typically a p-n junction diode. The use of a p-n junction may limit the scalability of the overall memory array inter alia because the p-n junction may not be very vertically scaleable.

Thus, there is a need for better ways to isolate phase change memory elements.

DETAILED DESCRIPTION

Figure 1:
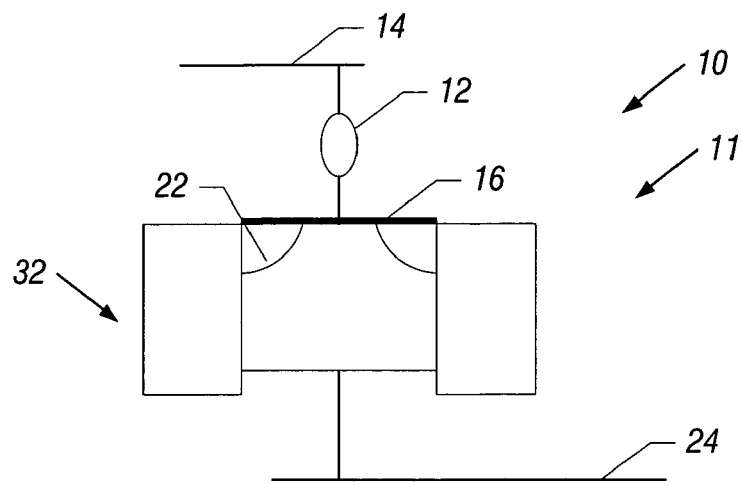
FIG. 1 is a schematic depiction of one embodiment of the present invention.

Referring to FIG. 1, a phase change memory cell 12 in a phase change memory device 10 may be coupled to a bitline 14 on one side and to an isolation diode 11 on the other side in one embodiment. The isolation diode 11 couples the memory cell 12 to a word line 24. The word line 24 may be formed in a silicon substrate 32 with high doping and relatively low resistivity in one embodiment.

The isolation diode 11 may be a Schottky diode or contact including a metal or metal silicide layer 16 over a substrate 18 that may have a so-called background doping level. The doping levels of the substrate is less than or equal to about $10^{17}$ atoms per cubic centimeter in one embodiment. The diode 11 and memory cell 12, bitline 14 and word line 24 may all be formed in the same semiconductor substrate that includes the substrate 18 in one embodiment.

The area of the isolation diode 11 may be defined by oxide or junction isolation regions 20. These regions 20 may be formed by oxide filled trenches, oxidized regions, or by junctions, as a few examples. A guard ring 22 may be formed between the substrate 18 and the isolation regions 20 in some embodiments. The guard ring 22 may be doped oppositely to the type of the substrate 18 and, in some embodiments, the guard ring 22 may have slightly higher doping concentration levels than the substrate 18. The guard ring 22 reduces the leakage currents of the isolation diode 11.

By using a Schottky diode in place of a p-n junction diode, a memory that may be more scaleable may be created because of the avoidance of a p-n junction which may not be very vertically scaleable. The guard ring 22 may not create a scalability problem since the doping level of the guard ring 22 is relatively small and the design criteria for the Schottky isolation diode 11 guard ring 22 may be much more scaleable than a p-n junction of a p-n junction diode. The Schottky diode may have much lower doping levels and the guard ring 22 may only handle leakage currents under reverse bias conditions. A normal p-n junction would need to deal with both reverse and forward bias conditions, higher currents, and higher doping levels. As a result, the diode 11 may be more vertically scaleable than conventional isolation diodes, resulting in greater density per unit area in the overall phase change memory 10.

In one embodiment of the present invention, the isolation diode 11 may be formed by initially isolating the region 18 using an appropriate form of isolation 20. A source drain implant that may be utilized on other portions of the substrate may be avoided in the substrate 18. An appropriate masking process may be utilized to form the guard ring 22, for example, by ion implantation. Thus, the existing background doping in the semiconductor substrate 18 may be suitable in some cases for the Schottky diode and all that may be done is to form the guard ring of the opposite conductivity type to that of the substrate 18. Thereafter, the contact 16 may be formed by depositing a metal or forming a metal silicide, as two examples.

Figure 2:
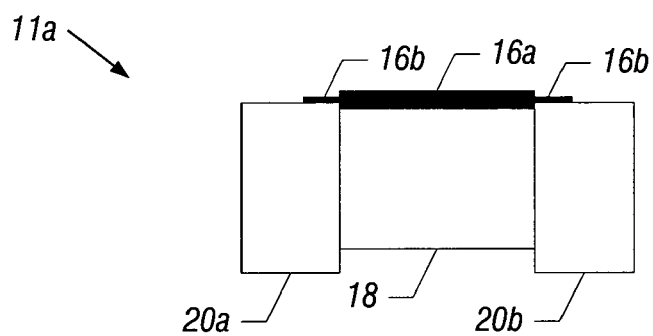
FIG. 2 is a schematic depiction of another embodiment of the present invention.

Referring to FIG. 2, in accordance with another embodiment of the present invention, a Schottky diode 11a includes a metal contact layer 16a with extensions 16b that extend over the isolation regions 20. The structure shown in FIG. 2 may reduce the leakage currents under reverse bias when oxide is used for the isolation 20. Thus, the need for guard rings may be reduced.

Figure 3:
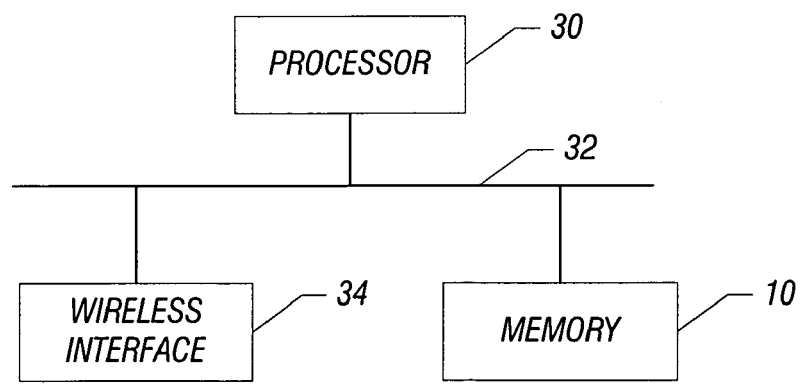
FIG. 3 is a schematic depiction of another embodiment of the present invention.

Referring to FIG. 3, a semiconductor integrated circuit may include, for example, a processor 30 coupled to a bus 32. The bus 32 may be coupled to a wireless interface 34 in one embodiment, such as a wireless transceiver, a cell phone, an antenna, or other wireless device. The memory 10 may be coupled to the bus 32. While an embodiment is disclosed in which a cellular telephone or other radio frequency device is illustrated, the present invention is in no way limited to any particular applications and may be utilized in a variety of applications amenable to the use of semiconductor memories.

Figure 4:
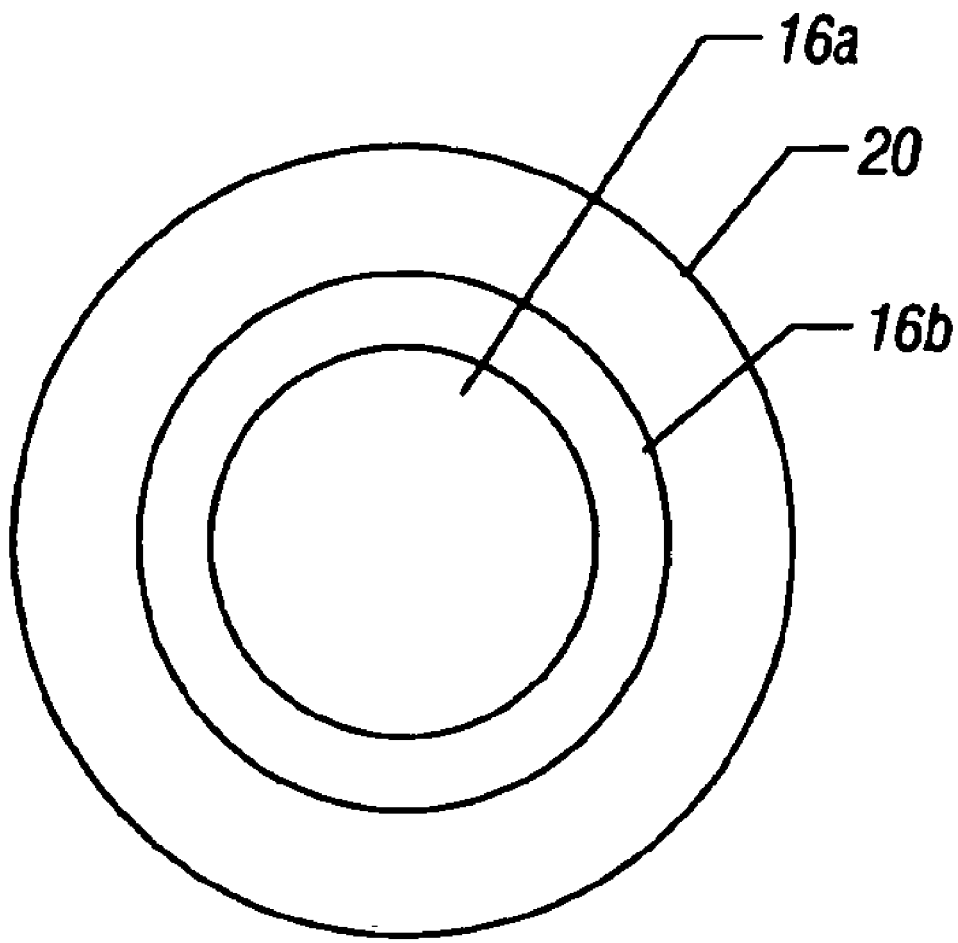
FIG. 4 is a top plan view of the embodiment shown in FIG. 2.

While the present invention has been described with respect to a limited number of embodiments, those skilled in the art will appreciate numerous modifications and variations therefrom. It is intended that the appended claims cover all such modifications and variations as fall within the true spirit and scope of this present invention. Referring to FIG. 4, the isolation region 20 surrounds the contact layers 16a extension 16b.

What is claimed is:

1. A phase change memory comprising:
a bulk substrate;
a chalcogenide phase change memory cell formed over said bulk substrate; and
an isolation diode in the form of a Schottky diode including a contact formed on and in contact with a region of said bulk substrate, said bulk substrate region having a background doping level silicon, the region under said contact being free of any p-n junction.

2. The memory of claim 1 wherein said isolation diode includes the contact wherein the contact is made of metallic material.

3. The memory of claim 1 wherein said isolation diode includes the contact wherein the contact is made of silicide material.

4. The memory of claim 1 wherein said Schottky diode is surrounded by an isolation region, said Schottky diode includes the contact wherein the contact is made of metallic material.

5. The memory of claim 1 wherein said background doping level is less than or equal to $10^{17}$ atoms per cubic centimeter.

6. The memory of claim 1 wherein said memory cell is coupled to a bitline and to said isolation diode and said isolation diode is connected to a word line.

7. The memory of claim 1 wherein said isolation diode is surrounded by an isolation region.

8. The memory of claim 1 including an isolation diode coupled to a word line, said isolation diode including a substrate having a background doping level.

9. A method comprising:
forming chalcogenide phase change memory cells over a bulk semiconductor substrate having a background doping level less than or equal to $10^{17}$ atoms per cubic centimeter;
forming a Schottky diode by forming a contact on and in contact with a region of said substrate having a background doping level, such that there is no p-n junction under said diode;
surrounding the Schottky diode by an isolation region;
forming said contact to extend over said isolation region; and
coupling one of said cells to another of said cells through said Schottky diode.

10. The method of claim 9 including coupling said Schottky diode between a memory cell and a word line.

11. A phase change memory comprising:
a bulk semiconductor substrate;
a chalcogenide phase change memory cell formed over said substrate;
a word line; and
a Schottky diode between said word line and said memory cell, an oxide isolation region around said diode, said diode including a contact, said contact extending over said isolation region, said contact formed on and in contact with a region of said substrate having a background doping level less than or equal to $10^{17}$ atoms per cubic centimeter, there being no p-n junction under said contact.

12. The memory of claim 11 wherein said word line is formed as a doped region in said substrate.

13. A system comprising:
a processor;
a memory coupled to said processor, said memory including a chalcogenide phase change memory cell formed over a bulk semiconductor substrate and an isolation diode in the form of a Schottky diode including a contact formed on said substrate, an oxide isolation region around said diode, said contact extending over said isolation region, said substrate under said contact having a doping level less than or equal to $10^{17}$ atoms per cubic centimeter, there being no p-n junction under said contact; and
a wireless interface coupled to said processor.

14. The system of claim 13 including a word line, said Schottky diode being between the word line and memory cell.

* * * * *